United States Patent [19]
Bottka

[11] 4,144,540
[45] Mar. 13, 1979

[54] TUNABLE INFRARED DETECTOR WITH NARROW BANDWIDTH

[75] Inventor: Nicholas Bottka, Ridgecrest, Calif.

[73] Assignee: The United States of America as represented by the Secretary of the Navy, Washington, D.C.

[21] Appl. No.: 875,254

[22] Filed: Feb. 6, 1978

[51] Int. Cl.² ........................................... H01L 27/14
[52] U.S. Cl. ......................................... 357/30; 357/16
[58] Field of Search .................................. 357/30, 16

[56] References Cited

U.S. PATENT DOCUMENTS

| | | | |
|---|---|---|---|
| 3,821,777 | 6/1974 | James | 357/39 |
| 3,978,511 | 8/1976 | Digoy | 357/30 |
| 4,083,062 | 4/1978 | Ohuchi | 357/13 |

Primary Examiner—Martin H. Edlow
Attorney, Agent, or Firm—R. S. Sciascia; W. Thom Skeer; K. G. Pritchard

[57] ABSTRACT

An infrared detector with narrow band tunable response. The detector is composed of four layers of epitaxially grown material that is doped for selective wavelength absorption. The uppermost layer has a thickness much larger than the penetration depth of short wavelength radiation or the diffusion length of photo generated carriers near the surface. The upper layer is a heavily N-doped layer over a P-doped layer. The cut-on wavelength edge is determined by the amount of doping in the uppermost layer. By applying a reverse bias to this N-P junction, the cut-off absorption edge can be shifted to longer wavelengths.

9 Claims, 3 Drawing Figures

TUNABLE INFRARED DETECTOR WITH NARROW BANDWIDTH

BACKGROUND OF THE INVENTION

This invention pertains to infrared detectors. Specifically, it refers to infrared detectors whose cut-off and cut-on response spectrum can be adjusted without interference filters over a very narrow spectral bandwidth.

Photodetector response curves reach a maximum near their fundamental absorption edge and then decrease toward the shorter wavelengths. This is primarily due to surface recombination of generated photocarriers.

Previous efforts to provide narrow bandwidth have used interference filters to eliminate short wavelength radiation. The spectral response of these filters is angle of incidence dependent. This is a serious drawback as the filter has to be aimed to function effectively for radiation from a small source. Even aiming does not help if the radiation is coming from several directions.

SUMMARY OF THE INVENTION

A four layer semi-conductor device for narrow spectral bandwidth detection is made from a direct narrow gap material with narrow energy gaps, that has small conduction band effective mass. The bottom substrate layer is highly P-doped. Upon the substrate, a highly P-doped buffer layer is epitaxially grown. The buffer layer can either be of the same material as the substrate or an alloy material of the substrate material.

A detector layer is epitaxially grown upon the buffer layer. The detector layer is made of the same material as the buffer layer. The detector layer has a cut-off wavelength, $\lambda_0$, which is a characteristic of the material used in this layer. The detector layer is either moderately doped or not doped.

The final or top layer is epitaxially grown on the detector layer. It has the same composition as the detector layer except it is very heavily N-doped. The extent of doping of this layer determines the cut-on absorption edge $\lambda_1$ of this material. This layer must be thicker than the penetration depth of radiation whose wavelength is shorter than $\lambda_1$ and the diffusion length of photo carriers generated at the surface of this topmost layer.

By applying a reverse bias to the N-P junction in this detector, the fundamental absorption edge $\lambda_0$ is shifted to longer wavelengths. This shift can be substantial if avalanche conditions are present in the junction.

DESCRIPTION OF THE PREFERRED EMBODIMENT

Figure 1:
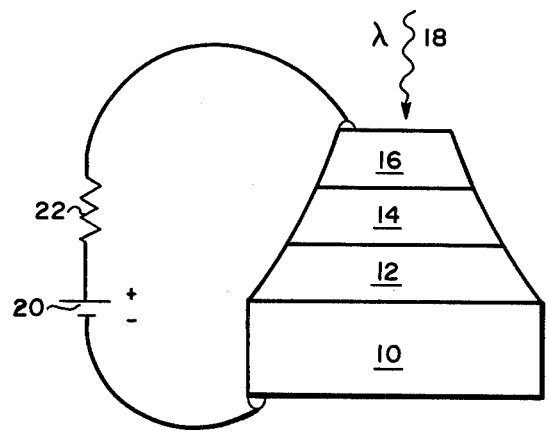
FIG. 1 is a drawing of the present invention.

In FIG. 1, substrate 10 is made of either InAs, InSb, PbTe, PbSe, SnTe, SnSe or one of the pseudo-binary alloys of these materials. By referring to a periodic table, it can be seen that these materials are either III-V or IV-VI combinations that have a narrow energy gap. They also have a small conduction band effective mass and are direct gap materials.

The term pseudo-binary alloy is also known as ternary alloy. There are three elements in the material. As an example, GaAs has a 1.42 eV gap and is a III-V compound. It has not been listed as a possible material because the 1.42 eV gap is not a narrow energy gap. InAs, which has been listed, does have a narrow gap of 0.36 eV. GaAs and InAs can be combined to give a pseudo-binary alloy of $Ga_xIn_{1-x}As$, where x equals the atomic percentage of Ga normalized to the number of As atoms. This pseudo-binary alloy can have any energy gap from 0.36 eV to 1.42 eV depending on the value of x. The energy gaps for the materials listed correspond to the infrared portion of the electro-magnetic spectrum.

Substrate 10 is cut, polished, highly P-doped and about 1 mm thick. The phrases "highly doped" or "heavily doped" refer to the fact that the number of impurity atoms added have yielded a low resistivity material. Low doping levels yield a high resistivity material. Upon substrate 10, buffer layer 12 is epitaxially grown. Buffer layer 12 can be either the same material as substrate 10 or consist of a graded alloy composition. This graded alloy composition of the buffer layer allows lattice matching of the substrate with the final detector layer. As well known in the art, graded lattice matching permits smooth changes in potential between layers. Without lattice matching, discrete potential jumps will exist in the detector which will not permit uniform tuning of the cut-off wavelength. Tuning or shifting of the cut-off edge will be discussed further on.

Active detector layer 14 is grown epitaxially on top of buffer layer 12. It consists of the same material as buffer layer 12 except that it is either moderately doped or not doped. This layer has a characteristic cut-off wavelength, $\lambda_0$, at which it stops absorbing energy. This cut-off depends on the material used. Wavelengths longer than $\lambda_0$ are not absorbed in the detector layer 14. Wavelengths shorter than $\lambda_0$ are absorbed but the spectral response decreases as the wavelengths get shorter.

Top layer 16 is epitaxially grown on detector layer 14. It is the same material as the detector layer 14 but is very heavily N-doped. Top layer 16 is much thicker than normal detectors. The thickness must be much larger than the penetration depth of wavelengths shorter than the characteristic absorption wavelength, $\lambda_1$, of top layer 16. It must also be thicker than the diffusion length of photo current generated near the surface of top layer 16. Top layer 16 has an optical absorption edge cut-on, $\lambda_1$, that is different from the adjoining P layer due to conduction band population by extrinsic carriers. This effect causes the fundamental absorption edge, $\lambda$, to shift to a shorter wavelength than $\lambda_0$ and can be controlled by the amount of doping. This effect is known as the Burstein-Moss shift and is based on the Pauli exclusion principle.

Figure 2:
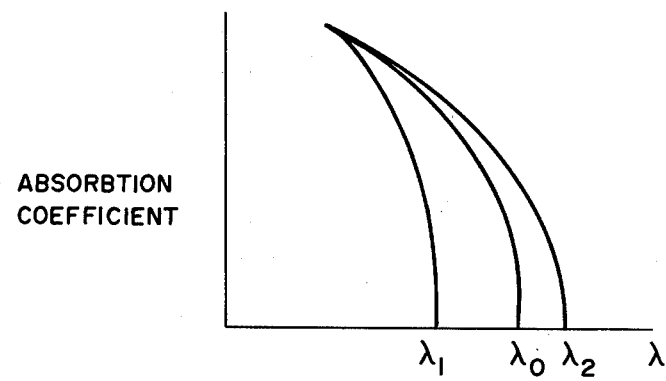
FIG. 2 is a graph of absorbent coefficient vs wavelength for the present invention.

FIG. 2 shows the absorption coefficients for top layer 16 and detector layer 14. Cut-off $\lambda_1$ of top layer 16 can be shifted to shorter and shorter wavelengths by doping top layer 16 with more extrinsic carriers. The gap between $\lambda_0$ and $\lambda_1$ can be made as narrow as desired.

Thus, radiation 18 in FIG. 1 of wavelength $\lambda$ will pass through top layer 16 if $\lambda$ is longer than $\lambda_1$ and be absorbed in detector layer 14 if $\lambda$ is shorter than $\lambda_0$. Upon absorption, photo current is generated between the P-N junction. Wavelengths shorter than $\lambda_1$ are absorbed near the surface of top layer 16. Photo current generated near the surface recombines in surface states and never reaches the P-N junction.

The net effect of this construction is a narrow spectral bandwidth filter between $\lambda_1$ and $\lambda_1$ which is controlled by the type of material used to determine $\lambda_0$ and the amount of doping to determine $\lambda_1$. The filter is operative for radiation having any incident angle.

An additional feature of this detector is the ability to shift the $\lambda_0$ cut-off edge towards longer wavelengths by applying a large reverse bias to the detector. High electric fields produced in the N-P junction shift the fundamental absorption edge $\lambda_0$ to longer wavelengths according to the Franz-Keldysh mechanism. Battery 20 in FIG. 1 is one method of providing the reverse bias. Resistor 22 is a means for measuring the current changes when light shines on the detector.

Figure 3:
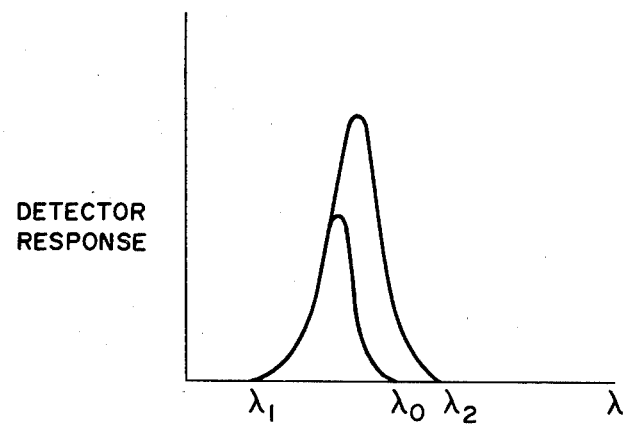
FIG. 3 is a graph of the overall relative response of the present invention vs wavelength.

The reverse bias shift can be as large as 300 Å under avalache conditions in the junction. This permits the spectral bandwidth to change from $\lambda_1-\lambda_0$ to $\lambda_1-\lambda_2$ as shown in FIG. 2. FIG. 3 shows how the relative response of the detector changes with increasing bandwidth.

What is claimed is:

1. A tunable energy detector comprising:
a P-type semi-conductor substrate;
a P-type buffer layer epitaxically grown on said substrate of semi-conductor material;
an active detector material layer epitaxially grown on said buffer layer which has a wavelength cutoff, $\lambda_0$, characteristic of said detector material; a top heavily N-doped layer of the same material composition as said detector material layer epitaxially grown on said detector material layer, where said top layer has a fundamental absorption edge $\lambda_1$ determined by the amount of doping which is a shorter wavelength than cut-off wavelength, $\lambda_0$, and is thicker than the penetration depth of wavelengths shorter than $\lambda_1$ and the diffusion length of the photo generated carriers near the surface of said top layer; and means for measuring current between said detector material layer and said top layer attached to said top layer and said substrate; said p type buffer layer is of graded compomition for extending the lattice match between said substrate and said detector layer such that there is uniform potential change between said substrate and detector layers.

2. A tunable energy detector as described in claim 1 wherein said active detector material layer is moderately P-doped.

3. A tunable energy detector as described in claim 1 where said detector is made of material selected from the group consisting of InAs, InSb, PbTe, PbSe, SnTe, SnSe and their pseudo-binary alloys.

4. A tunable energy detector as described in claim 1, further comprising means for providing a reverse bias to said detector connected to said top layer and said substrate whereby said reverse bias shifts cut-off wavelength $\lambda_0$ to longer wavelength.

5. A tunable energy detector as described in claim 4 wherein said active detector material layer is moderately P-doped.

6. A tunable energy detector as described in claim 4 wherein said P-type buffer layer is of graded composition for extending the lattice match between said substrate and said detector layer such that there is a uniform potential change between said substrate and detector layers.

7. A tunable energy detector as described in claim 4 where said detector is made of material selected from the group consisting of InAs, InSb, PbTe, PbSe, SnTe and their pseudobinary alloys.

8. A tunable energy detector as described in claim 7 wherein said active detector material layer is moderately P-doped.

9. A tunable energy detector as described in claim 7 wherein said P-type buffer layer is of graded composition for extending the lattice match between said substrate and said detector layer such that there is a uniform potential change between said substrate and detector layers.

* * * * *